(12) United States Patent
Raikin

(10) Patent No.: US 10,491,241 B1
(45) Date of Patent: Nov. 26, 2019

(54) DATA COMPRESSION SCHEME UTILIZING A REPETITIVE VALUE WITHIN THE DATA STREAM

(71) Applicant: Habana Labs Ltd., Tel Aviv (IL)

(72) Inventor: Shlomo Raikin, Yassur (IL)

(73) Assignee: Habana Labs Ltd., Caesarea (IL)

( * ) Notice: Subject to any disclaimer, the term of this patent is extended or adjusted under 35 U.S.C. 154(b) by 0 days.

(21) Appl. No.: 16/024,862

(22) Filed: Jul. 1, 2018

Related U.S. Application Data (60) Provisional application No. 62/528,455, filed on Jul. 4, 2017.

(51) Int. Cl.
*H03M 7/30* (2006.01)
*H03M 7/40* (2006.01)

(52) U.S. Cl.
CPC ....... *H03M 7/6011* (2013.01); *H03M 7/6005* (2013.01); *H03M 7/40* (2013.01)

(58) Field of Classification Search
CPC ..... H03M 7/6011; H03M 7/6005; H03M 7/40
See application file for complete search history.

(56) References Cited

U.S. PATENT DOCUMENTS

| | | | | |
|---|---|---|---|---|
| 6,101,221 A | * | 8/2000 | Varanasi | H04N 19/61 348/718 |
| 6,112,208 A | | 8/2000 | Ikegami | |
| 6,188,338 B1 | * | 2/2001 | Yokose | H03M 7/40 341/65 |
| 6,216,903 B1 | | 4/2001 | Hirose et al. | |
| 2005/0105125 A1 | * | 5/2005 | Park | H04N 1/41 358/1.15 |
| 2006/0238390 A1 | * | 10/2006 | Yi | H04N 19/94 341/87 |
| 2010/0316113 A1 | * | 12/2010 | Jang | H03M 7/40 375/240 |

OTHER PUBLICATIONS

Huffman, "A Method for the Construction of Minimum-Redundancy Codes," Proceedings of the IRE, vol. 40, issue 9, pp. 1098-1101, Sep. 1952.

* cited by examiner

*Primary Examiner* — Jean B Corrielus
(74) *Attorney, Agent, or Firm* — Kligler & Associates (57) ABSTRACT

An apparatus includes an input interface and compression circuitry. The input interface is configured to receive input source data. The compression circuitry in configured to set a symbol anchor value, having a highest occurrence probability among the symbol values in the input source data, to generate a bit-map by (i) for every symbol in the input source data whose symbol value is the anchor value, setting a respective bit in the bit-map to a first binary value, and (ii) for every symbol in the source data whose symbol value differs from the anchor value, setting the respective bit in the bit-map to a second binary value, and to generate compressed data including (i) the bit-map and (ii) the symbols whose symbol values differ from the symbol anchor value.

22 Claims, 8 Drawing Sheets

| Non-Compressed Data | 0 | 2 | 10 | 0 | 0 | 0 | 51 | 0 | 88 | 94 | 0 | 0 | 0 | 0 | 0 | 0 | 0 | 0 | 0 | 0 | 0 | 30 | 0 | 0 |
|---|---|---|---|---|---|---|---|---|---|---|---|---|---|---|---|---|---|---|---|---|---|---|---|---|
| Bitmap | 0 | 1 | 1 | 0 | 0 | 0 | 1 | 0 | 1 | 1 | 0 | 0 | 0 | 0 | 0 | 0 | 0 | 0 | 0 | 0 | 0 | 1 | 0 | 0 |
| Non-Anchor Data | 2 | 10 | 51 | 88 | 94 | 30 | | | | | | | | | | | | | | | | | | |

102 → Non-Compressed Data
104 → Bitmap
106 → Non-Anchor Data

DATA COMPRESSION SCHEME UTILIZING A REPETITIVE VALUE WITHIN THE DATA STREAM

CROSS-REFERENCE TO RELATED APPLICATIONS

This application claims the benefit of U.S. Provisional Patent Application 62/528,455, filed Jul. 4, 2017, whose disclosure is incorporated herein by reference.

FIELD OF THE INVENTION

The present invention relates generally to signal processing, and particularly to methods and systems for lossless digital data compression.

BACKGROUND OF THE INVENTION

Data compression, also known as source coding or, mostly in communication systems, as bit-rate reduction, is the process of encoding the bits structure of data in such a way that its size (typically expressed in bits), will be smaller than the original size. Data decompression is the process of reconstructing the original data from the compressed data.

The main benefits of data compression are smaller storage size for the data, and faster data communication. The main drawbacks are computing resources needed for the compression and for the decompression, and, in communication systems, increased latency.

Data compression is divided into lossy and lossless types. In lossy compression techniques the reconstructed data is not always identical to the original data. It is useful in applications where some inaccuracy is acceptable; for example, in image compression. In contrast, in lossless compression, all bits of the reconstructed data must be identical to the bits of the source data.

A cornerstone technique for lossless data compression is Huffman compression, described by Huffman, in "A Method for the Construction of Minimum-Redundancy Codes," Proceedings of the IRE, 40 (9), pages 1098-1101.

Another common compression technique is Lempel-Ziv (LZ) compression, wherein the encoding tree is built and refined while the source data is read.

SUMMARY OF THE INVENTION

An embodiment that is described herein provides an apparatus including an input interface and compression circuitry. The input interface is configured to receive input source data. The compression circuitry in configured to set a symbol anchor value, having a highest occurrence probability among the symbol values in the input source data, to generate a bit-map by (i) for every symbol in the input source data whose symbol value is the anchor value, setting a respective bit in the bit-map to a first binary value, and (ii) for every symbol in the source data whose symbol value differs from the anchor value, setting the respective bit in the bit-map to a second binary value, and to generate compressed data including (i) the bit-map and (ii) the symbols whose symbol values differ from the symbol anchor value.

In some embodiments, the apparatus further includes a transmitter configured to transmit the compressed data to a receiver. In some embodiments, the symbol anchor value is predefined. In other embodiments, the compression circuitry is configured to identify the symbol anchor value by finding a symbol value having the highest occurrence probability in the input source data.

In an embodiment, the compression circuitry is configured to further generate a notification of the symbol anchor value. In a disclosed embodiment, in generating the compressed data, the compression circuitry is configured to further compress one or more of (i) the bit-map and (ii) the symbols whose symbol values differ from the symbol anchor value.

There is additionally provided, in accordance with an embodiment of the present invention, an apparatus including decompression circuitry and an output interface. The decompression circuitry is configured to set a symbol anchor value, to extract from compressed input data (i) a bit-map, and (ii) symbols whose symbol values differ from the symbol anchor value, and to generate decompressed output data by (i) for every bit in the bit-map that equals a first binary value, generating an anchor symbol in the decompressed output data, and (ii) for every bit in the bit-map that equals a second binary value, generating a symbol in the decompressed output data that is equal to a corresponding symbol in the non-anchor data. The output interface is configured to output the decompressed output data.

In some embodiments, the apparatus further includes a receiver, configured to receive the compressed input data from a transmitter. In some embodiments, the symbol anchor value is predefined. In other embodiments, the decompression circuitry is configured to receive a notification of the symbol anchor value. In a disclosed embodiment, in generating the decompressed data, the decompression circuitry is configured to decompress one or more of (i) the bit-map and (ii) the symbols whose symbol values differ from the symbol anchor value.

There is further provided, in accordance with an embodiment of the present invention, a method including receiving input source data, and setting a symbol anchor value, having a highest occurrence probability among the symbol values in the input source data. A bit-map is generated, by (i) for every symbol in the input source data whose symbol value is the anchor value, setting a respective bit in the bit-map to a first binary value, and (ii) for every symbol in the source data whose symbol value differs from the anchor value, setting the respective bit in the bit-map to a second binary value. Compressed data, which includes (i) the bit-map and (ii) the symbols whose symbol values differ from the symbol anchor value, is generated.

There is also provided, in accordance with an embodiment of the present invention, a method including setting a symbol anchor value, and extracting from compressed input data (i) a bit-map, and (ii) symbols whose symbol values differ from the symbol anchor value. Decompressed output data is generated, by (i) for every bit in the bit-map that equals a first binary value, generating an anchor symbol in the decompressed output data, and (ii) for every bit in the bit-map that equals a second binary value, generating a symbol in the decompressed output data that is equal to a corresponding symbol in the non-anchor data. The decompressed output data is provided as output.

The present invention will be more fully understood from the following detailed description of the embodiments thereof, taken together with the drawings in which:

DETAILED DESCRIPTION OF EMBODIMENTS

Overview

A compression system compresses an input source, which will be referred to hereinafter as "Non-Compressed Data" or "Non-Compressed Data Segment," and generates a reduced-size representation thereof, which will be referred to hereinafter as "Compressed Data" or "Compressed Data Segment." A decompression system decompresses the reduced-size Compressed Data and generates the Decompressed Data.

In a compression system, the terms "Source Data" or "Source Data Segment" will refer, respectively, to Non-Compressed Data and Non-Compressed Data Segment; whereas the terms "Target Data" or "Target Data Segment" will refer, respectively, to Compressed Data and Compressed Data Segment. Similarly, in a decompression system, the terms "Source Data" or "Source Data Segment" will refer, respectively, to Compressed Data and Compressed Data Segment; whereas the terms "Target Data" or "Target Data Segment" will refer, respectively, to Non-Compressed Data and Non-Compressed Data Segment.

The ratio between the size of the Non-Compressed Data and the size of the Compressed Data will be referred to hereinafter as the "Compression Ratio."

In embodiments of the present invention, the Non-Compressed Data, the Compressed Data and other intermediate data, may comprise any suitable type of data medium, e.g., computer files, or segments of memory locations, for example, in a Random-Access Memory (RAM). The term "segment" will be used hereinafter to denote either a file or a segment in memory.

In many practical data compression applications, the Source Data comprises a dominant (i.e., frequently-occurring) symbol, which has an occurrence probability that is higher than the occurrence probability of all other symbols. For example, in some machine learning applications, approximately 90% of the model weights are zero. The value of such dominant symbol will be referred to hereinafter as "Anchor Value," and symbols having the anchor value as "Anchor Symbols."

According to embodiments of the present invention, a compression system compresses source data by: a) generating a symbol bit map for the source data, wherein occurrences of Anchor Symbols are denoted by a first binary value (for example, logic-zero), and wherein occurrences of other symbols is denoted by a second binary value (for example, logic-one); and, b) generating a Compressed Data Segment comprising the source data with the anchor symbols removed (will be referred to hereinafter as "Non-Anchor Data"), and the Bit Map.

In some embodiments, the compression system may further compress the Non-Anchor data, the bit map, or both, using any suitable compression technique, for example Huffman coding.

According to embodiments of the present invention, decompression is the reverse of the compression, and a decompression system may decompress a Compressed Data Segment by setting the value of symbols for which the bit of the symbol Bit Map equals a first binary value to a symbol from the non-anchor data, and to an anchor symbol if the bit of the symbol Bit Map equals a second binary value. In some embodiments, if the Bit Map or the non-anchor data (or both) are compressed, the decompression described hereinabove may be preceded by decompression of the Bit Map or the non-anchor data (or both), using any suitable decompression technique, for example Huffman coding.

In some embodiments of the present invention, an anchor value setting step, wherein the symbol with the highest repetition rate is found, precedes the other steps of the compression.

Compression and decompression according to embodiments of the present invention are relatively simple to implement, and yet provide good compression ratio in applications wherein the occurrence frequency of anchor symbols is high. Consequently, embodiments of the present invention may be suitable for hardware implementation of high speed compression and decompression systems.

System Description

Figure 1:
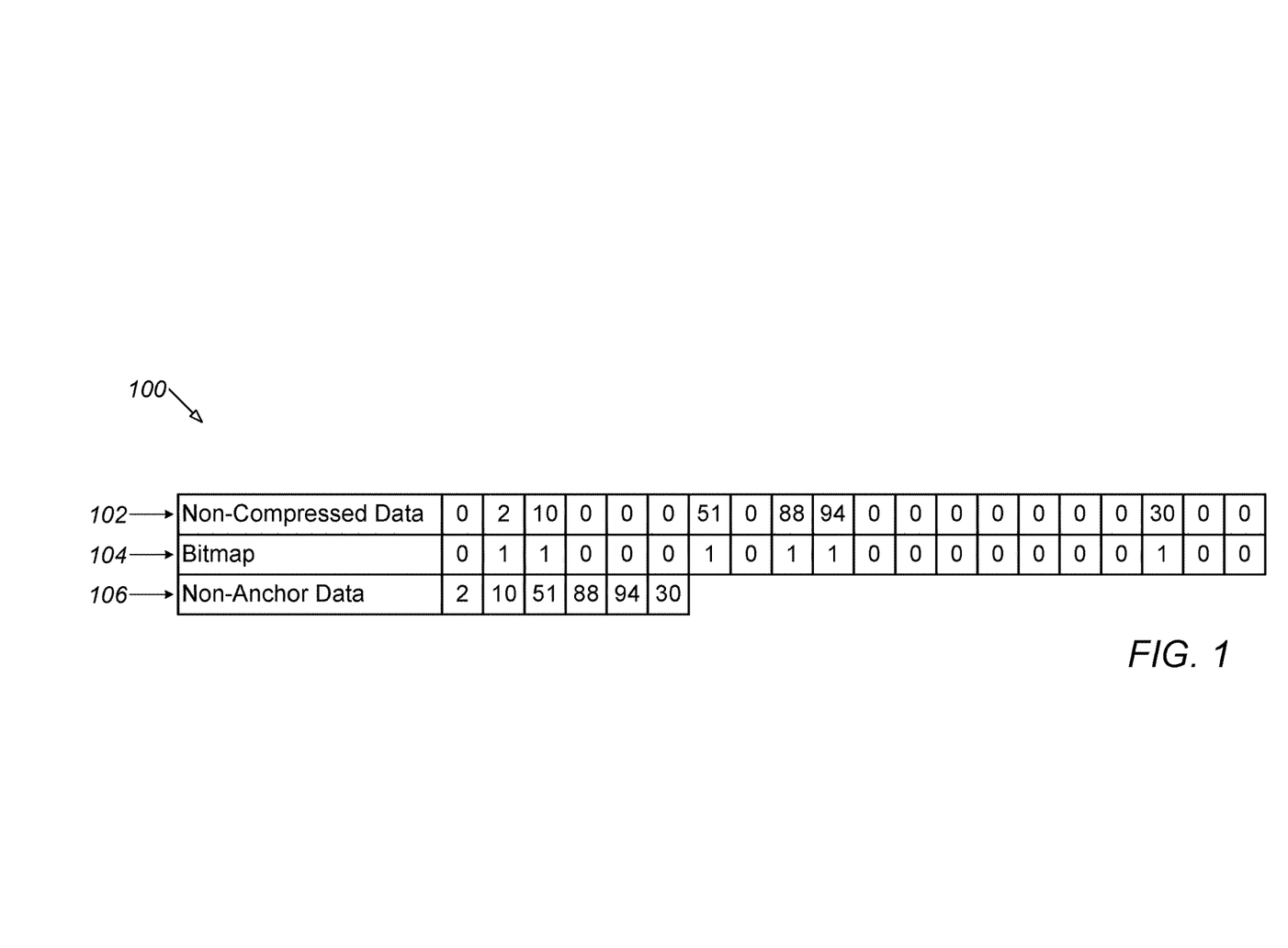
FIG. 1 is a table that schematically illustrates an example of a compression of a non-compressed data source block, in accordance with an embodiment of the present invention.

FIG. 1 is a table 100 that schematically illustrates compression of data in accordance with embodiments of the present invention. The table comprises an example Non-Compressed Source Data Segment 102, a Bit-Map 104, and a Non-Anchor Data Segment 106.

In the present example, symbols are 8-bit wide, and the anchor value is the symbol 0. Source Data Segment 102 comprises twenty symbols, and has anchor symbols in the first, fourth, fifth, sixth, eighth, eleventh, twelfth, thirteenth, fourteenth, fifteenth, sixteenth, seventeenth, and twentieth locations.

Bit-Map 104 is a map of the symbols in Source Data Segment 102. According to the present example, the length of Bit-Map 104 is twenty bits. Bits of the bit-map that correspond to the locations of the anchor symbols are set to logic-0, whereas bits that correspond to the locations of the non-anchor symbols are set to logic-1. In the present example, as most of the symbols are anchor symbols, only the second, third, seventh, ninth, tenth and eighteenth bits of Bit Map 104 will be set to logic-1. In alternative embodiments, the bit map may use the opposite convention, i.e., represent the locations of the anchor values with logic-1 and the locations of the non-anchor values with logic-0.

Non-Anchor Data 106, according to embodiments of the present invention, comprises all symbols of Non-Compressed Source Data Segment 102, which are Non-Anchor Symbols. In the present example, the length of the Non-Anchor Data is six symbols.

The size of the Non-Compressed Data Source is 20*8=160 bits. The size of the non-anchor data is 6*8=48 bits, and the size of the Bit-Map is 20 bits. The compression ratio is, therefore, 160/(48+20)=2.35.

FIGS. 2A, 2B, 3A and 3B describe apparatuses and methods for the compression and decompression of data, according to embodiments of the present invention, wherein the compressed data comprises a bitmap followed by the non-anchor data. Alternative embodiments may be used; some alternative embodiments will be described hereinbelow.

Figure 2A:
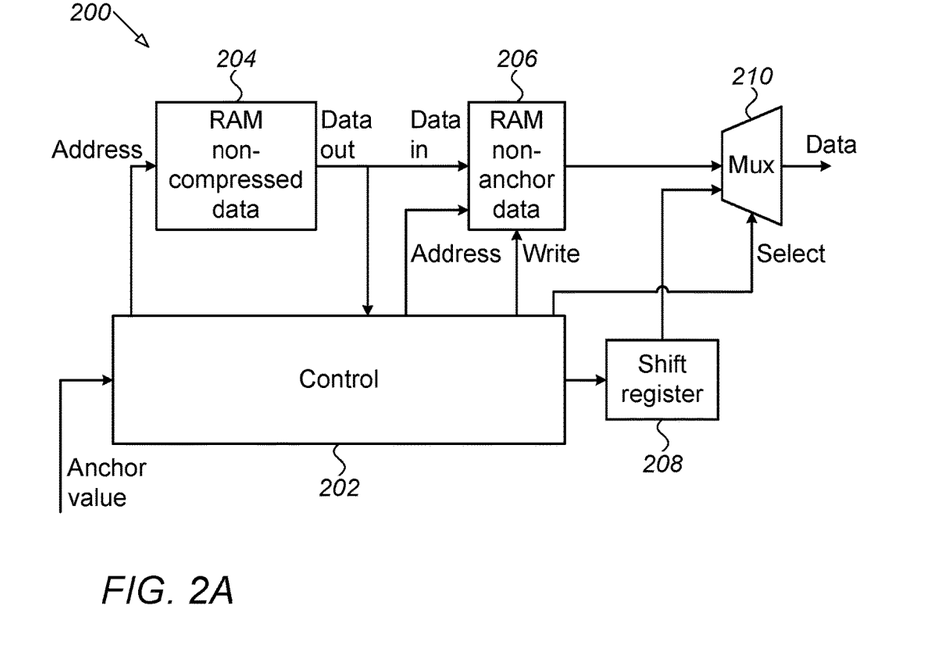
FIG. 2A is a block diagram that schematically illustrates an apparatus, which compresses data, according to some embodiments of the present invention.

FIG. 2A is a block diagram that schematically illustrates an example of an Apparatus 200, which compresses data according to some embodiments of the present invention. The apparatus comprises: a Control Unit 202, configured to control the compression operation; a first RAM 204, which is preloaded with the data that is to be compressed, a second RAM 206, configured to store the non-anchor data, a shift register 208, configured to store the bitmap, and a multiplexor 210, configured to output the compressed data.

According to the present example embodiment, Control Unit 202 gets the anchor value as input. In other embodiments Control Unit 202 may calculate the anchor value, for example by scanning RAM 204 and finding the most frequent symbol value.

Control Unit 202 sends addresses to first RAM 204, to sequentially read the non-compressed data symbols. When the read symbol is equal to the Anchor Value, Control Unit 202 writes a first binary value in Shift Register 208. When the read symbol is not equal to the Anchor Value, the Control Unit writes a second binary value in the Shift Register, and writes the symbol in second RAM 206, which stores the non-anchor data.

After Control Unit 202 reads the last symbol from RAM 204, sets the last bit of Shift Register 208 to a first or a second binary value, and, if the symbol is not an anchor symbol, writes the last non-anchor symbol to RAM 206, the compressed data is ready in RAM 206 and shift register 208. The Control unit may then control Multiplexor 210 to first output the bitmap from Shift Register 208, and then output the non-Anchor Data from RAM 206.

Figure 2B:
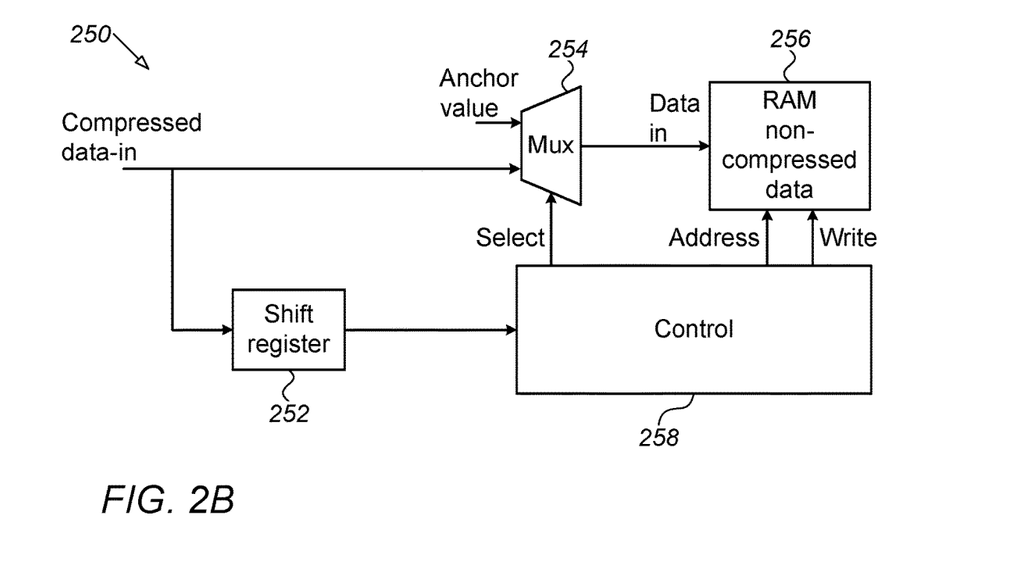
FIG. 2B is a block diagram that schematically illustrates an apparatus, which decompresses data, according to some embodiments of the present invention.

FIG. 2B is a block diagram that schematically illustrates an example of an apparatus 250, which decompresses data according to embodiments of the present invention. The apparatus comprises: a Shift Register 252, configured to store the bitmap of the compressed data, a Multiplexor 254, configured to output either the received non-anchor data or the anchor value, a RAM 256, configured to store the decompressed data symbols, and a Control Unit 258, configured to control the decompression operation.

According to the present example embodiment, compressed data that is input to Apparatus 250 comprises the bitmap of the compression followed by the non-anchor data. When Apparatus 250 receives a stream of compressed data, Shift Register 252 will first store the bitmap. Thereafter, for every symbol that the Apparatus receives, Control Unit 258 reads a bit from Shift Register 252; if the bit is of a first binary value, the Control Unit controls Multiplexor 254 to output the Anchor Value; if the bit read from the Shift Register is of a second binary value, the Control Unit controls Multiplexor 254 to output the next symbol from the input of Apparatus 250.

Control Unit 258 further controls RAM 256 to sequentially store the output of Multiplexor 254, which will comprise the decompressed symbols.

Figure 3A:
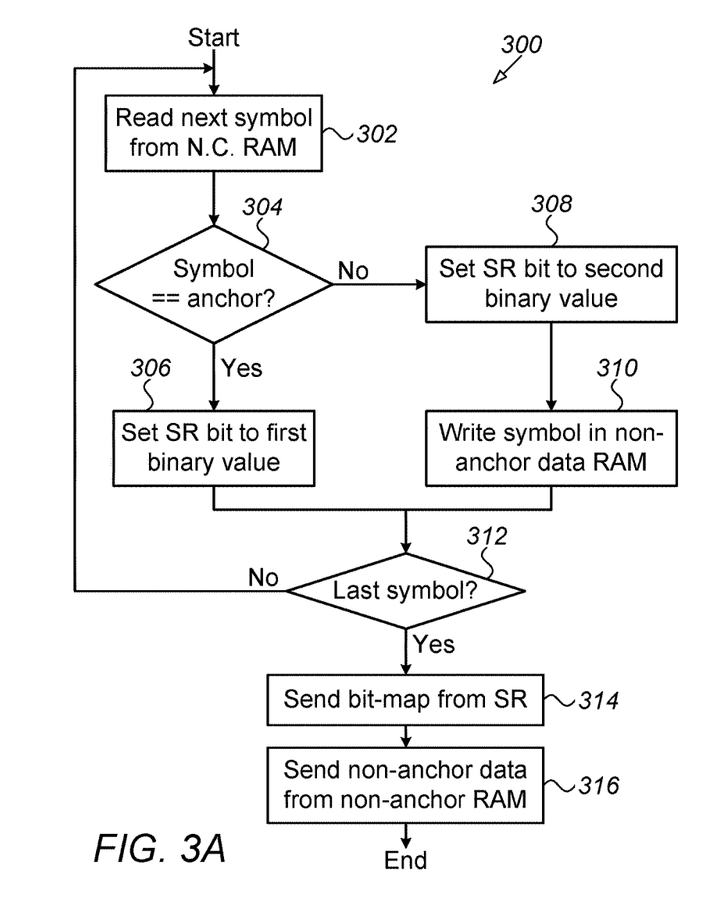
FIG. 3A is a flow chart that schematically illustrates a first method for data compression, in accordance with an embodiment of the present invention.

FIG. 3A is a flow chart 300 that schematically illustrates a method for data compression in accordance with an embodiment of the present invention. The flow chart is executed by Control Unit 202 (FIG. 2A).

The flow chart starts at a Reading Next Symbol step 302, wherein the Control Unit reads a symbol from Non-Compressed Data RAM 204 (FIG. 2A). Next, in a Comparing Symbol to Anchor step 304, the Control Unit checks if the symbol is an anchor symbol. If the symbol is an Anchor symbol the Controller enters a Setting SR Bit to First Binary Value step 306, wherein a bit in Shift Register 208 (FIG. 2A) is set to a first binary value, and then enters a Checking Last Symbol step 312.

If, in Step 304, the Controller find that the symbol is not an anchor symbol, the Controller will enter a Setting SR Bit to Second Binary Value step 308, wherein a bit in Shift Register 208 (FIG. 2A) is set to a second binary value. The controller then enters a Writing-Non-Anchor-Symbol step 310, wherein it writes the symbol (which was read in step 302) in Non-Anchor Data RAM 206 (FIG. 2A). After Step 310 the Controller enters Checking Last Symbol step 312.

If, in Step 312, the Controller finds that the current symbol is not the last symbol, it re-enters Step 302, to read the next symbol. If, in Step 312, the current symbol is the last symbol, compression is complete, and ready to be sent out from Apparatus 200. The Controller now enters a Sending Bitmap step 314, wherein the controller sends the bitmap from Shift Register 208, and then a Sending Non-Anchor-data step 316, wherein the controller sends the non-anchor data from Non-Anchor Data RAM 206. After Step 316 the compression flow ends.

Figure 3B:
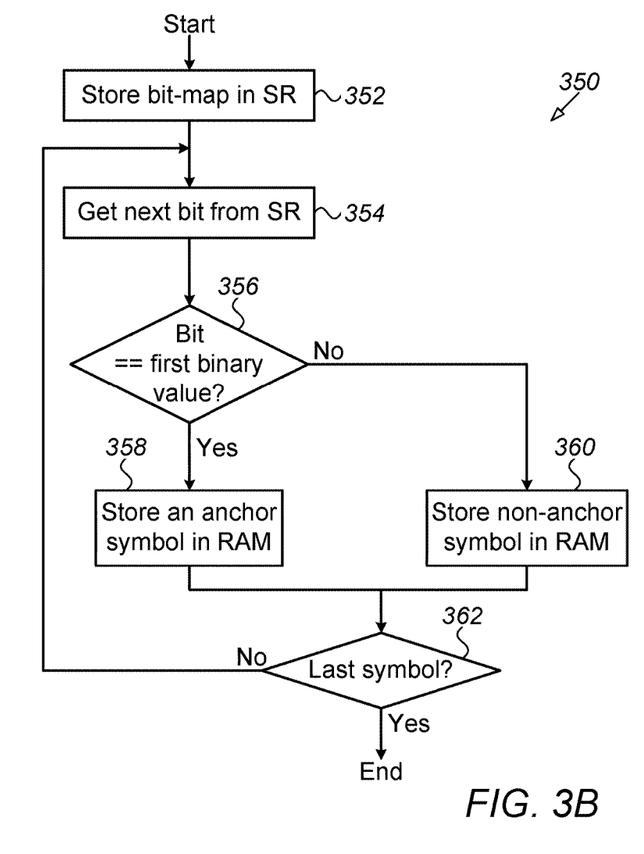
FIG. 3B is a flow chart that schematically illustrates a first method for data decompression, in accordance with an embodiment of the present invention.

FIG. 3B is a flow chart 350 that schematically illustrates a method for data decompression in accordance with an embodiment of the present invention. The flow chart is executed by Control Unit 258 (FIG. 2B).

The flow chart starts in a Storing bit-map In Shift Register step 352, wherein the Controller stores the bitmap part of the compressed data in Shift Register 252 (FIG. 2B). Next, in a Getting-Next-Bit-From-Shift-Register step 354, the controller gets the next bit of the bitmap from shift register 252 (FIG. 2B), and then enters a Checking-Bit step 356, wherein the Controller checks the value of a bit from Shift Register 252.

If, in Step 356, the bit is of a first binary value, the Controller will enter a Storing Anchor Symbol step 358, wherein the Controller will store an anchor symbol in RAM 256 (FIG. 2B). If, in Step 356, the bit is of a second binary value, the Controller will store the next symbol of the compressed data in RAM 256.

After either Step 358 or Step 360, the Controller enters a Checking-for-Last-Symbol step 362, wherein the Controller checks if the current symbol is the last symbol to be decompressed. If the current symbol is not the last symbol to be decompressed, the Controller re-enters Step 354, whereas if the current symbol is the last symbol, the decompression flow chart ends.

FIGS. 4A, 4B, 5A, and 5B describe examples of apparatuses and methods for the compression and decompression of data according to embodiments of the present invention.

In all four figures, it is assumed that the anchor value is either a-priori known to both the transmitter and the receiver, or else transmitted by means, which is not shown. In the example embodiments of FIGS. 4A, 4B, 5A, and 5B a bit of the bit-map is transmitted for each symbol of the decompressed data source. If the bit is of a first binary value, its transmission will be followed by the transmission of the next bit from the bit-map. If the bit is of a second binary value, its transmission will be followed by the transmission of the next non-anchor symbol of the decompressed data source.

Figure 4A:
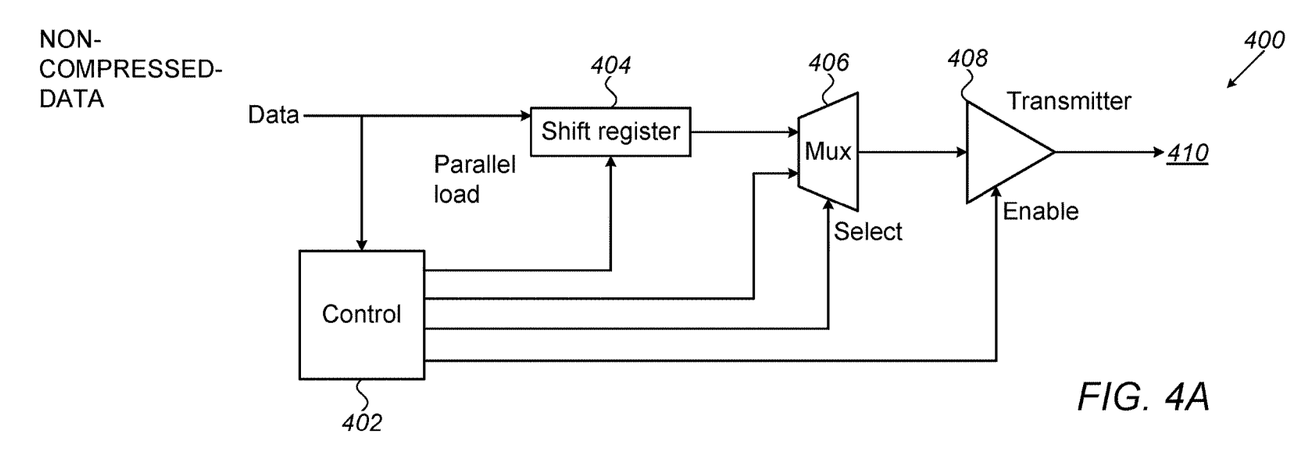
FIG. 4A is a block diagram that schematically illustrates an apparatus, which compresses data, according to an alternative embodiment of the present invention.

FIG. 4A is a block diagram that schematically illustrates an example of an Apparatus 400, which compresses data according to some embodiments of the present invention. The Apparatus comprises: a Control Unit 402, configured to control the compression operation; a Shift Register 404, configured to convert symbols to series of bits; a Bit-Multiplexor 406, configured to assert on its output either bits from Shift Register 404 or a bit that indicates if a symbol is an anchor symbol, output by Control Unit 402; a Transmitter 408, configured to output input from Bit-Multiplexor 406 on a communication medium 410, which may be any serial communication medium.

According to the example of FIG. 4A, input to compression system 400 comprises non-compressed data symbols, which are stored in shift register 404.

Control Unit 402 sets Bit-Multiplexor 406 to output to Transmitter 408 a first binary value if the symbol is an anchor symbol, and a second binary value if it is not. If the read symbol is not an anchor symbol, Control Unit 402 will next control Shift Register 404 to serially output all bits of the input symbol to Bit-Multiplexor 406, and will set Bit-Multiplexor 406 to transfer the bits that the multiplexor receives from the Shift Register, to Transmitter 408.

Control Unit 402 further controls Transmitter 408 to transmit the bit received from Bit-Multiplexor 406 on Communication Medium 410, from the time that Bit-Multiplexor 406 outputs the first bit to Transmitter 408, and until the Bit-Multiplexor outputs the last bit of the last symbol if the last symbol is not an anchor symbol, or the last first binary value if the last symbol is an anchor symbol, to Transmitter 408.

Thus, for every symbol in the source data, Transmitter 408 will transmit over Communication Medium 410, either a single first binary value, if the symbol is an anchor, or a single second binary value followed by all the bits of the symbol, if the symbol is not an anchor.

If there are n b-bit uncompressed symbols, and if the probability that a symbol is an anchor symbol is p (0≤p≤1), then there are p*n anchor symbols and (1−p)*n non-anchor symbols, and the number of bits in the compressed data will be n+b*(1−p)*n, as compared to n*b bits in the uncompressed data. The compression ratio is b/(1+(1−p)*b). For example, if b=16 and p=90%, the compression factor will be 16/2.6≈6.15. Higher values of b and higher anchor-symbol probabilities increase the compression ratio.

The example apparatus of FIG. 4A receives the non-compressed data from an external source that is not shown. The disclosed techniques, however, are not limited to implementations in which the non-compressed data is input from an external source. Rather, in some embodiments of the present invention the non-compressed data source is internally generated, or internally stored, for example, in a Random-Access-Memory (RAM).

Figure 4B:
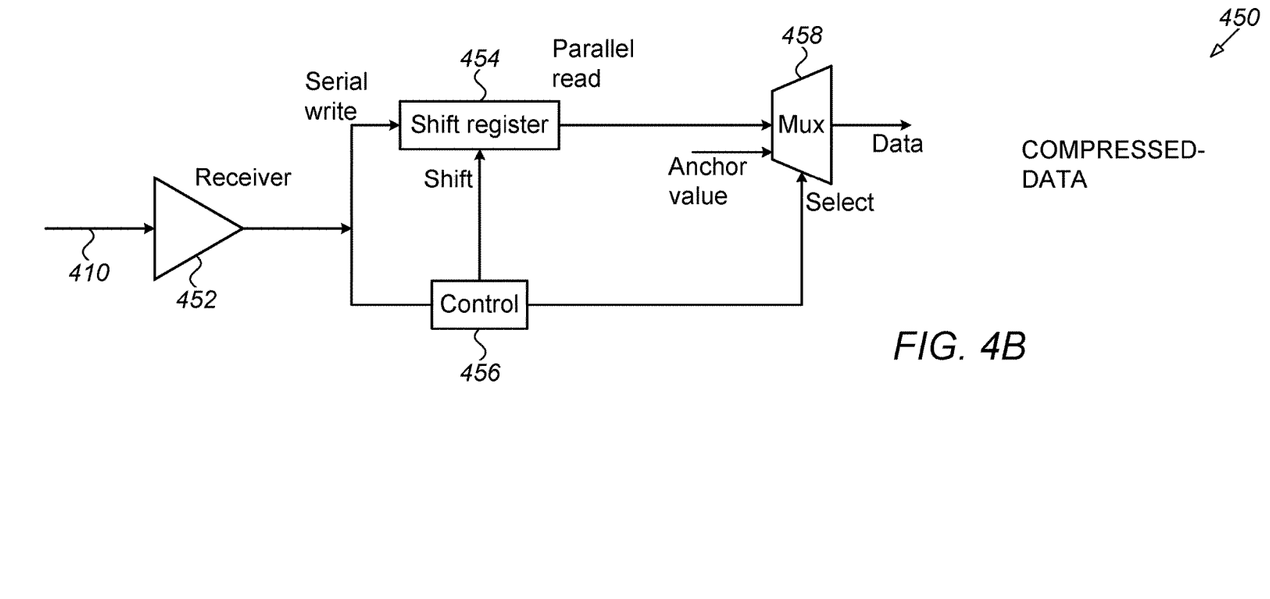
FIG. 4B is a block diagram that schematically illustrates an apparatus, which decompresses data, according to an alternative embodiment of the present invention.

FIG. 4B is a block diagram that schematically illustrates an example of an Apparatus 450, which decompresses data according to some embodiments of the present invention. The Apparatus comprises: a Receiver 452, configured to receive serial bits from Communication Medium 410; a Shift Register 454, configured to receive bits serially from the Receiver, and to output parallel representation of the received bits; a Control Unit 456, configured to control the decompression; and, a Symbol-Multiplexor 458, configured to output either symbols received from the Shift Register or anchor symbols. Decompression apparatus 450 serially outputs decompressed symbols.

According to the example of FIG. 4B, when Receiver 452 outputs a bit received from Communication Medium 410, Control Unit 456 checks if the received bit is of a first binary value, indicating an anchor symbol, or a second binary value, indicating a non-anchor symbol. If the symbol is an anchor symbol, the Control Unit sets Symbol-Multiplexor 458 to output an anchor symbol. If the symbol is non-anchor, the Control Unit controls Shift Register 454 to serially store the bits of the current symbol input from Receiver 452. After all bits of the current symbol are stored in Shift Register 454, the Control Unit sets Symbol Multiplexor 458 to output the current symbol read from Shift Register 454.

The example apparatus of FIG. 4B outputs the non-compressed data to an external destination that is not shown. The disclosed techniques, however, are not limited to implementations in which the non-compressed data is output to an external destination. Rather, in some embodiments of the present invention the non-compressed data destination is internal, or internally stored, for example, in a Random Access Memory (RAM). Moreover, the disclosed techniques are not limited to serial communication media. Rather, any suitable communication medium may be used, for example, a medium for the wireless transmission of QAM64 symbols.

Figure 5A:
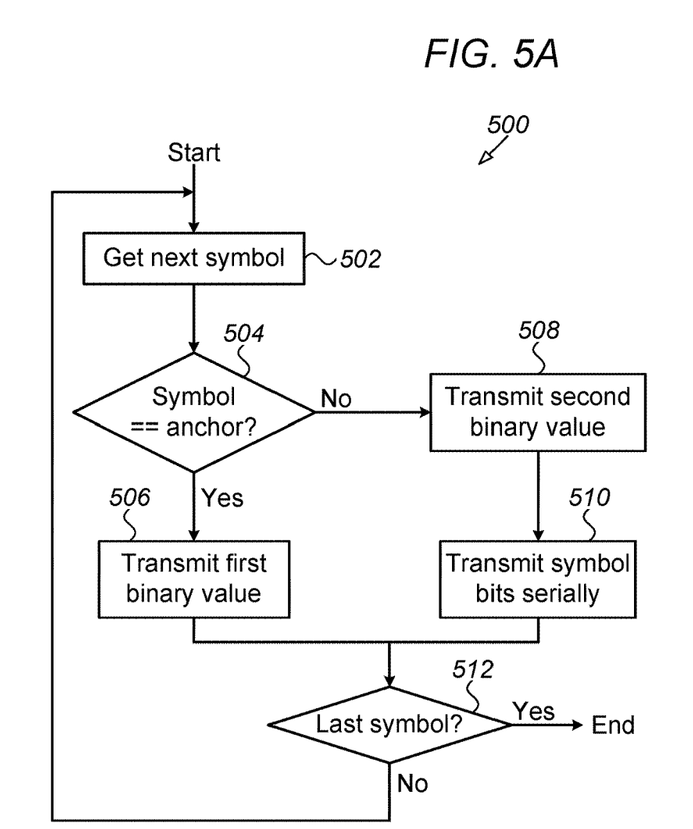
FIG. 5A is a flow chart that schematically illustrates a second method for data compression, according to an alternative embodiment of the present invention.

FIG. 5A is a flow chart 500 that schematically illustrates a method for data compression in accordance with an embodiment of the present invention. The flow chart is executed by Control Unit 402 (FIG. 4A). The chart starts at a Getting Symbol step 502, wherein the Control Unit receives a symbol from an external source. Next, in a Comparing Symbol to Anchor step 504, the Control Unit checks if the symbol that was received in step 502 is an anchor symbol; if the symbol is an anchor symbol, the Control Unit will go to a Transmitting First Binary Value step 506, wherein it will transmit a first binary value bit; whereas if the symbol is not an anchor symbol, the Control Unit will go to a Transmitting Secondary Binary Value step 508, wherein it will transmit a second binary value bit.

After executing step 508, the Control Unit enters a Transmitting Symbol Bits step 510, wherein bits of the symbol are serially transmitted. After executing either step 506 or step 510, the Control Unit executes a Checking Last Symbol step 512, wherein the Control Unit checks whether the current symbol is the last symbol to be compressed (for example, by examining a last-symbol input, not shown). If the current symbol is the last symbol to be compressed, the flow-chart ends. If the current symbol is not the last symbol to be compressed, the Control Unit will re-execute the steps described hereinabove, from step 502.

Figure 5B:
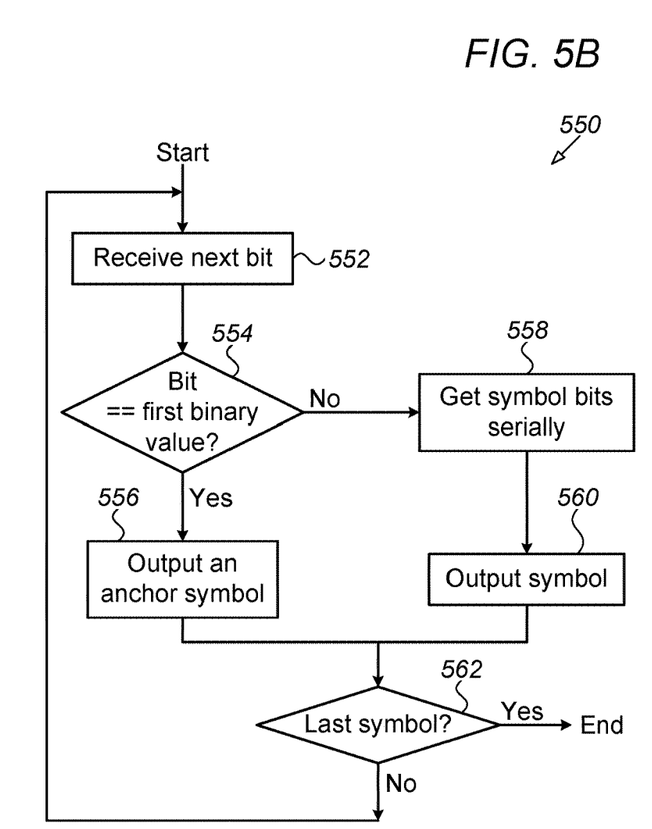
FIG. 5B is a flow chart that schematically illustrates a second method for data decompression, according to an alternative embodiment of the present invention.

FIG. 5B is a flow chart 550 that schematically illustrates a method for data decompression in accordance with an embodiment of the present invention. The flow chart is executed by Control Unit 456 (FIG. 4B). The chart starts at a Receiving-Next-Bit step 552, wherein the Control Unit receives a bit from Receiver 452. Next, in a Checking-Bit step 554, the Control Unit checks whether the bit is of a first binary value (indicating an anchor symbol).

If the bit is not of a first binary value, the Control Unit will, at a Getting-Symbol-Bits step 558, get all bits of the current symbol serially from the communication medium, and, at a Outputting-Symbol step 560, output a non-compressed symbol.

If, at step 554 the received bit is of a first binary value (indicating an anchor symbol), the Control Unit will, at a Outputting-Anchor-Symbol step 556, output an anchor symbol.

After either step 556 or step 560, the Control Unit will execute a Checking-Last-Symbol step 564, wherein the Control Unit checks whether the current symbol is the last symbol to be decompressed (for example, if the number of symbols is known, by counting symbols and comparing the current count to the number of symbols). If the current symbol is the last symbol to be decompressed, the flow-chart ends. If the current symbol is not the last symbol to be decompressed, the Control Unit will re-execute the steps described hereinabove, from step 552.

As would be appreciated, compression apparatuses 200 (FIG. 2A) and 400 (FIG. 4A), decompression apparatuses 250 (FIG. 2B) and 450 (FIG. 4B), compression methods 300 (FIG. 3A) and 500 (FIG. 5A), decompression methods 350 (FIG. 3B) and 550 (FIG. 5B), described hereinabove, are provided as examples. Embodiments of the present invention may comprise numerous variations of apparatuses 200, 250, 400, 450 and methods 300, 350, 500, 550; including (but not limited to) embodiments wherein the anchor value is transmitted prior to the transmission of the compressed data, embodiments wherein the anchor value is first calculated by a Control Unit or by a processor which is not shown in the figures, and embodiments wherein there are at least two communication media—one used for the non-anchor data and the other for the bit map.

Figure 6:
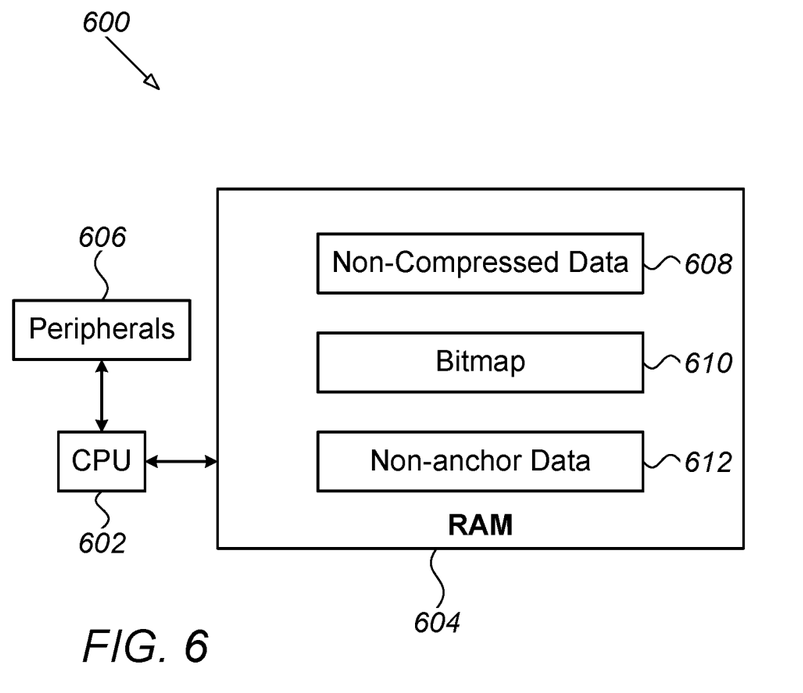
FIG. 6 is a block diagram that schematically illustrates a computer system, which compresses and decompresses data according to some embodiments of the present invention.

FIG. 6 is a block diagram that schematically illustrates a Computer 600, which is configured to compress and to decompress data, according to embodiments of the present invention.

Computer 600 may comprise a Central Processing Unit (CPU) 602, a RAM 604 and Peripherals 606. RAM 604 may store (momentarily or permanently) a Non-Compressed Data Segment 608, a Bit Map Segment 610, and Non-Anchor Data Segment 612.

According to this example embodiment, when Computer 600 is configured to compress data, Non-Compressed Data Segment 608 is the Source Data, while the aggregation of Bitmap 610 and Non-Anchor-Data 612 is the Target Data. Inversely, when Computer 600 is configured to decompress data, Non-Compressed Data Segment 608 is the Target Data, while the aggregation of Bitmap 610 and Non-Anchor-Data 612 is the Source Data.

To compress data, CPU 602 is configured to a) scan Non-Compressed Data Segment 608 and generate Bit Map 610, wherein, in Bit Map 610, a first binary value indicates an anchor symbol in the Source Data, and a second binary value indicates a non-anchor symbol; and, b) generate Non-Anchor Data Segment 612, which comprises all the non-anchor symbols of Uncompressed Data Segment 608.

To decompress data, CPU 602 is configured to scan Bit Map 610, and for every bit of the Bit Map, if its value is a first binary value, write an Anchor Symbol in Non-Compressed Data Segment 608, and if its value is a second binary value, copy a symbol from the Non-Anchor Data Segment 612 to the Non-Compressed Data Segment 608.

As would be appreciated, the embodiment described hereinabove, wherein a single Computer 600 may be configured to compress or decompress data, is given as an example. Embodiments of the present invention may include a computer configured to compress data and a computer configured to decompress data.

Figure 7:
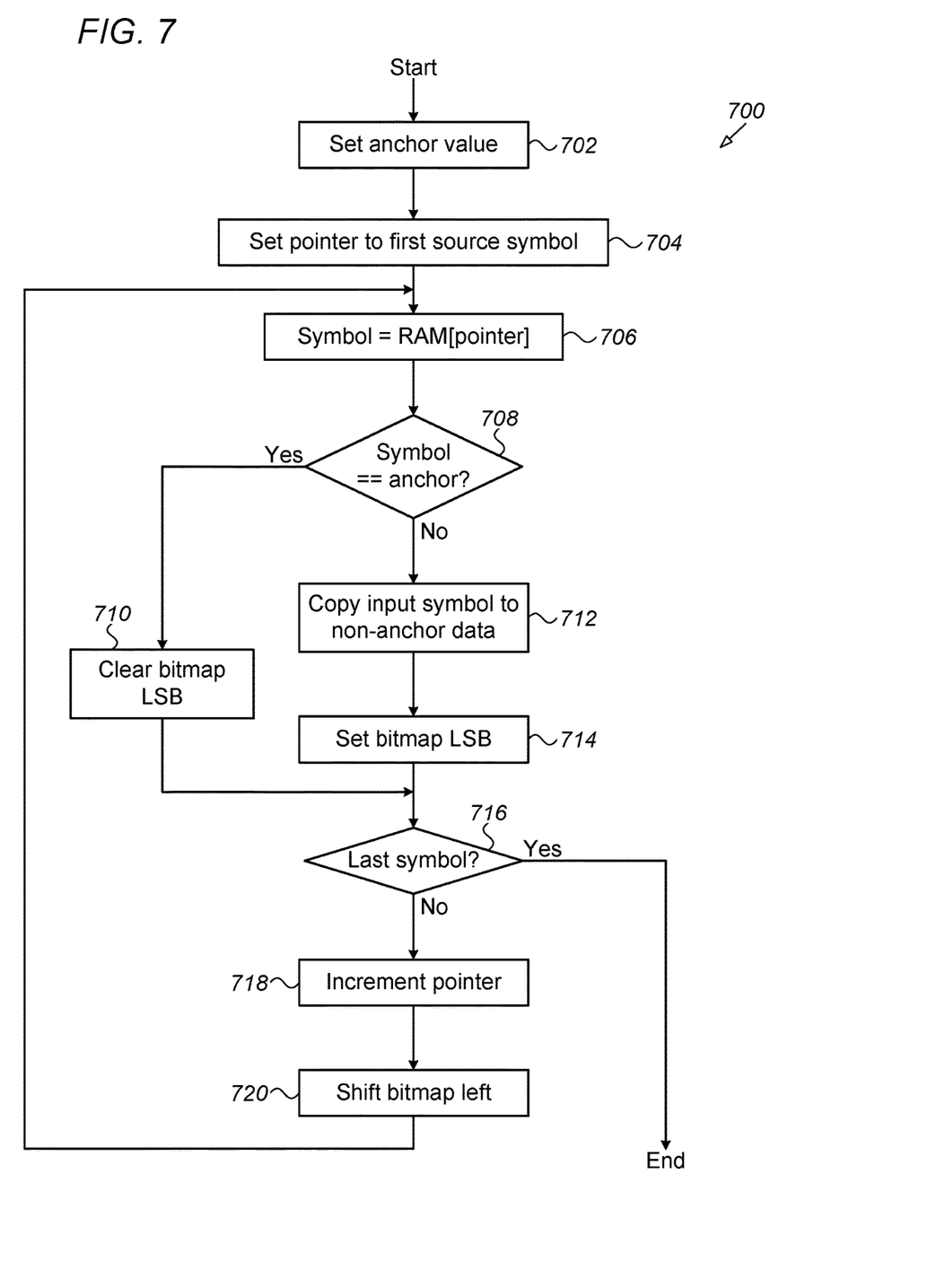
FIG. 7 is a flow chart that schematically illustrates a third method for data compression, in accordance with an embodiment of the present invention.

FIG. 7 is a flow chart 700 that schematically describes a data compression method according to embodiments of the present invention. The flow chart is executed by CPU 602 (FIG. 6).

The flow chart starts at a Setting-Anchor-Value step 702, wherein the CPU sets an anchor value, corresponding to the most common symbol value. In some embodiments, step 702 may comprise a statistical analysis to find the anchor value; in other embodiments the anchor value may be characteristic to the nature of the Source Data. For example, in some machine learning applications, the CPU may set the anchor value to zero.

Next, at a Setting-Pointer step 704, the CPU sets a pointer to point to the address in RAM 604 of the first symbol in Non-Compressed Data Segment 608 (see FIG. 6). Then, at a Getting-Symbol step 706, the CPU reads the symbol that the pointer points to from the Non-Compressed Data Segment.

At a Comparing-to-Anchor step 708, the CPU compares the value of the symbol read in step 706 to the anchor value. If the value of the symbol is equal to the anchor value, the CPU will execute a Clearing-Bit-Map step 710, wherein it will set the least-significant bit of Bit Map 610 to a first binary value (for example—logic 0). If, at step 708, the values of the symbol is not equal to the anchor value, the CPU will execute a Copying-Symbol step 712, wherein it will copy the symbol to Non-Anchor Data Segment 612, and then execute a Setting-Bit-Map-LSB step 714, wherein it will set the least-significant bit of Bit Map 610 to a second binary value (for example, logic-1).

After either step 710 or step 714, the CPU executes a Checking-Last-Symbol step 716, wherein the CPU checks if the current symbol is the last symbol in Non-Compressed Data Segment 608; upon finding that the symbol is not the last symbol in the Non-Compressed Data Segment, the CPU will execute an Incrementing-Pointer step 718, wherein the CPU will increment the pointer, and a enter Shifting-Bit-Map-Left step 720, wherein the CPU will shift the bit map to the left.

After executing step 720, the CPU will re-enter step 706. The CPU will thus execute a series of steps, a number of times equal to the number of symbols in Non-Compressed Data Segment 608; the series of steps comprising steps 706, 708, 712, 714, 716, 718 and 720 when the symbol read in step 706 is a non-anchor symbol, and steps 706, 708, 710, 716, 718 and 720, when the symbol read in step 706 is an anchor symbol.

If, at step 716, the current symbol is the last symbol in Compressed Data Segment 608, the compression ends.

Figure 8:
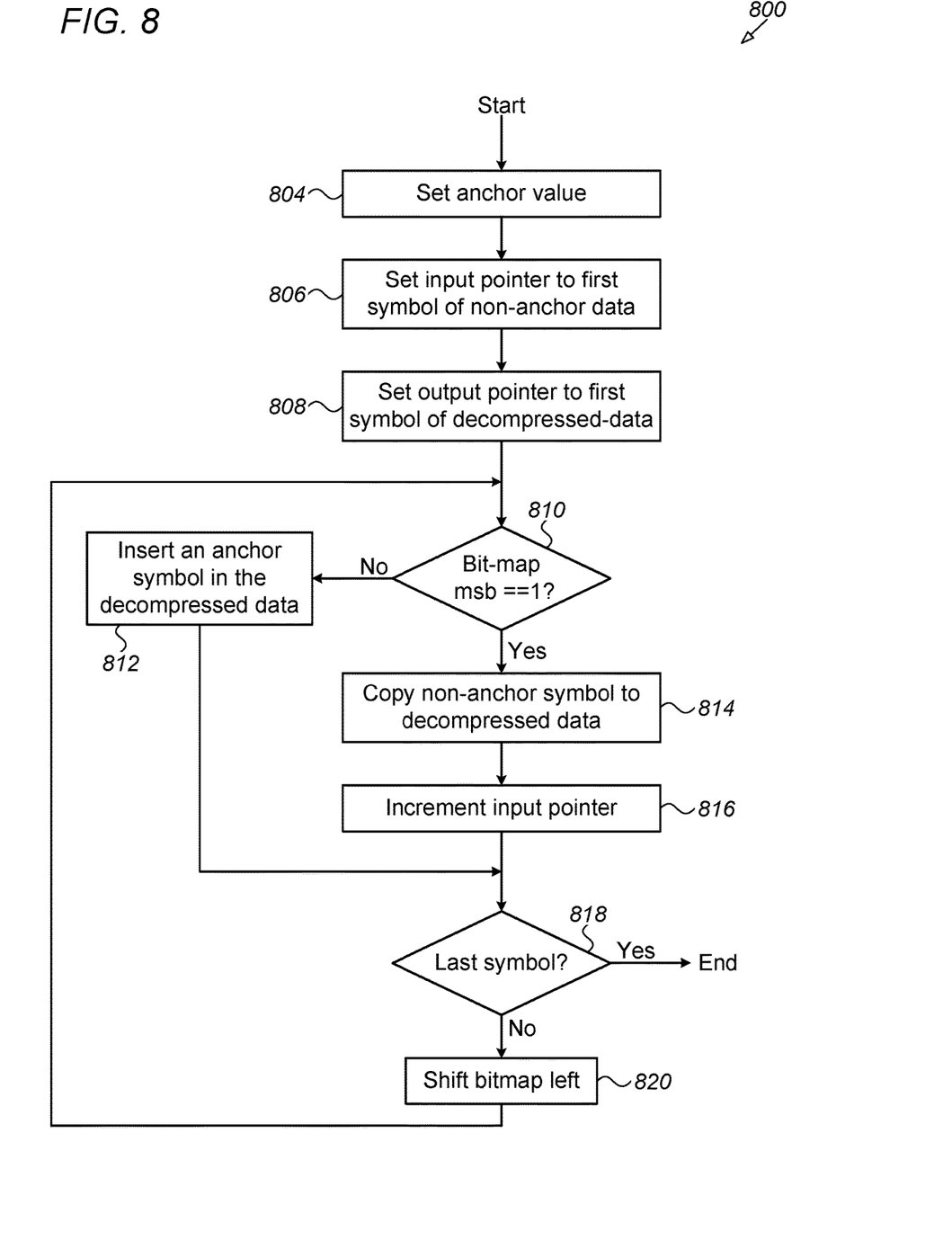
FIG. 8 is a flow chart that schematically illustrates a third method for data decompression, in accordance with an embodiment of the present invention.

FIG. 8 is a flow chart 800 that schematically illustrates a method for data decompression in accordance with an embodiment of the present invention. The steps of the flow chart are executed by CPU 602 (FIG. 6), which reads and writes data segments 608, 610 and 612 (FIG. 6). Decompression flow chart 800 starts at a Setting-Anchor-Value step 804, wherein the CPU sets an anchor value. According to embodiments of the present invention, the anchor value is fixed, for example, 0. In other embodiments the anchor value is appended to the compressed data segment (not shown in the present example); in yet other embodiments, the anchor value may be communicated to the CPU that executes the decompression by other means, which are not shown in the current example.

Next, in a Setting-Input-Pointer step 806, the CPU sets an Input Pointer (for example, a CPU register) to point to the first symbol in Non-Anchor Data Segment 612. Then, in a Setting-Output-Pointer step 808, the CPU sets an Output Pointer (for example, another CPU register) to point to the first symbol of the Decompressed Data Segment 608.

In a Checking-Bit-Map step 810, the CPU checks the value of the Most-Significant (MS) bit of Bit Map 610. In the current example, a set MS bit indicates non-anchor data. If the MS bit is set, the CPU will execute a Copying-Non-Anchor Symbol step 814, wherein the CPU copies the non-anchor symbol that the Input Pointer points to, to the Decompressed Data Segment, at the location that the output pointer points to.

After step 814, the CPU executes an Incrementing-Input-Pointer step 816, wherein the CPU increment the input pointer by one, to point to the next non-anchor symbol in Non-Anchor Data Segment 612.

If, at Checking-Bit-Map step 810, the MS bit of Bit Map 610 is not set, the CPU executes an Inserting-Anchor-Symbol step 812, and writes the anchor value into the Decompressed Data Segment, at the location that the output pointer points to.

After either step 812 or step 816, the CPU enters a Checking-for-Last-Symbol step 818, wherein it checks if the current output symbol is the last symbol. If the current output symbol is the last one, the flow chart ends, and the decompression is complete. If the current output symbol is not the last one, the CPU enters a Shifting-Bit-Map step 820, wherein the Bit Map Is shifted left, so that the MS bit will refer to the next output symbol, and then the CPU re-executes step 810. The CPU will thus loops through steps 810, 812, 818, 820 (or 812, 814, 816, 818, 820) until the CPU completes the decompression of the last symbol.

As would be appreciated, the compression and decompression methods, apparatuses and computers described hereinabove are provided as examples. Embodiments of the present invention may comprise numerous variations of compression and decompression methods, apparatuses and computers. For example, the bit map or the non-anchor data (or both) may be further compressed using any suitable compression technique; the anchor value may be calculated, or a-priori known; all in accordance to the Claims presented hereinbelow.

The configurations of apparatus 200 of FIG. 2A, apparatus 250 of FIG. 2B, apparatus 400 of FIG. 4A, apparatus 450 of FIG. 4B, and computer 600 of FIG. 6 are example configurations that are depicted purely for the sake of conceptual clarity. In alternative embodiments, any other suitable configuration can be used. Elements that are not mandatory for understanding of the disclosed techniques have been omitted from the figures for the sake of clarity.

In the embodiments described herein, the compression circuitry receives non-compressed input data for compression via a suitable input interface. In some embodiments, a memory in which the input data is stored serves as the interface. In some embodiments, a memory in which the non-compressed input data is stored serves as the input interface. In other embodiments, a receiver that receives the non-compressed input data serves as the input interface.

In the embodiments described herein, the decompression circuitry outputs the decompressed output data as output via a suitable output interface. In some embodiments, a memory in which the decompressed output data is stored serves as the output interface. In other embodiments, a transmitter that transmits the decompressed output data serves as the output interface.

In various embodiments, the different elements of apparatus 200, apparatus 250, apparatus 400, apparatus 450 and/or computer 600 may be implemented using suitable hardware, such as in an Application-Specific Integrated Circuit (ASIC) or Field-Programmable Gate Array (FPGA). Alternatively, some elements of apparatus 200, apparatus 250, apparatus 400, apparatus 450 and/or computer 600 may be implemented in software, or using a combination of software and hardware elements.

In some embodiments, any or all of control unit 204 control unit 256, Control Unit 402, Control Unit 456 and CPU 602 comprise a general-purpose processor, which is programmed in software to carry out the functions described herein. The software may be downloaded to the processor in electronic form, over a network or from a host, for example, or it may, alternatively or additionally, be provided and/or stored on non-transitory tangible media, such as magnetic, optical, or electronic memory.

The disclosed compression and decompression techniques can be used in various host systems and in a variety of applications, including any application that requires transferring or storing data at extreme throughput, wherein the data has a repetitive anchor value. Two examples may be Deep Learning, and the compression of phone audio where the line may be silent for at least 50% of the time.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus, comprising:
    an input interface, configured to receive an input source data; and
    compression circuitry, configured to:
        set a symbol anchor value, having a highest occurrence probability among symbol values in the input source data;
        generate a bit-map by (i) for every symbol in the input source data whose symbol value is the anchor value, setting a respective bit in the bit-map to a first binary value, and (ii) for every symbol in the source data whose symbol value differs from the anchor value, setting a respective bit in the bit-map to a second binary value; and
        generate a compressed data comprising (i) the bit-map and (ii) the symbols whose symbol values differ from the symbol anchor value.

2. The apparatus according to claim 1, further comprising a transmitter configured to transmit the compressed data to a receiver.

3. The apparatus according to claim 1, wherein the symbol anchor value is predefined.

4. The apparatus according to claim 1, wherein the compression circuitry is configured to identify the symbol anchor value by finding a symbol value having the highest occurrence probability in the input source data.

5. The apparatus according to claim 1, wherein the compression circuitry is configured to further generate a notification of the symbol anchor value.

6. The apparatus according to claim 1, wherein the compression circuitry is configured to apply additional compression to the compressed data, by compressing one or more of (i) the bit-map and (ii) the symbols whose symbol values differ from the symbol anchor value.

7. An apparatus, comprising:
decompression circuitry, configured to:
set a symbol anchor value;
extract from a compressed input data (i) a bit-map, and (ii) symbols whose symbol values differ from the symbol anchor value; and
generate a decompressed output data by (i) for every bit in the bit-map that equals a first binary value, generating an anchor symbol in the decompressed output data, and (ii) for every bit in the bit-map that equals a second binary value, generating a symbol in the decompressed output data that is equal to a corresponding symbol in the symbols whose symbol values differ from the symbol anchor value; and
an output interface, configured to output the decompressed output data.

8. The apparatus according to claim 7, further comprising a receiver, configured to receive the compressed input data from a transmitter.

9. The apparatus according to claim 7, wherein the symbol anchor value is predefined.

10. The apparatus according to claim 7, wherein the decompression circuitry is configured to receive a notification of the symbol anchor value.

11. The apparatus according to claim 7, wherein, in generating the decompressed data, the decompression circuitry is configured to decompress one or more of (i) the bit-map and (ii) the symbols whose symbol values differ from the symbol anchor value.

12. A method, comprising:
receiving an input source data;
setting a symbol anchor value, having a highest occurrence probability among symbol values in the input source data;
generating a bit-map by (i) for every symbol in the input source data whose symbol value is the anchor value, setting a respective bit in the bit-map to a first binary value, and (ii) for every symbol in the source data whose symbol value differs from the anchor value, setting a respective bit in the bit-map to a second binary value; and
generating a compressed data comprising (i) the bit-map and (ii) the symbols whose symbol values differ from the symbol anchor value.

13. The method according to claim 12, further comprising transmitting the compressed data to a receiver.

14. The method according to claim 12, wherein the symbol anchor value is predefined.

15. The method according to claim 12, wherein setting the symbol anchor value comprises identifying the symbol anchor value by finding a symbol value having the highest occurrence probability in the input source data.

16. The method according to claim 12, further comprising generating a notification of the symbol anchor value.

17. The method according to claim 12, and comprising applying an additional compression to the compressed data, by compressing one or more of (i) the bit-map and (ii) the symbols whose symbol values differ from the symbol anchor value.

18. A method, comprising:
setting a symbol anchor value;
extracting from a compressed input data (i) a bit-map, and (ii) symbols whose symbol values differ from the symbol anchor value; and
generating a decompressed output data by (i) for every bit in the bit-map that equals a first binary value, generating an anchor symbol in the decompressed output data, and (ii) for every bit in the bit-map that equals a second binary value, generating a symbol in the decompressed output data that is equal to a corresponding symbol in the symbols whose symbol values differ from the symbol anchor value; and
outputting the decompressed output data.

19. The method according to claim 18, further comprising receiving the compressed input data from a transmitter.

20. The method according to claim 18, wherein the symbol anchor value is predefined.

21. The method according to claim 18, wherein setting the symbol anchor value comprises receiving a notification of the symbol anchor value.

22. The method according to claim 18, wherein generating the decompressed data comprises decompressing one or more of (i) the bit-map and (ii) the symbols whose symbol values differ from the symbol anchor value.

* * * * *